(12) United States Patent
Tezuka

(10) Patent No.: US 8,394,230 B2
(45) Date of Patent: Mar. 12, 2013

(54) PLASMA PROCESSING APPARATUS

(75) Inventor: Kazuyuki Tezuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1130 days.

(21) Appl. No.: 12/161,238

(22) PCT Filed: Mar. 13, 2007

(86) PCT No.: PCT/JP2007/054941
§ 371 (c)(1),
(2), (4) Date: Jul. 17, 2008

(87) PCT Pub. No.: WO2007/108366
PCT Pub. Date: Sep. 27, 2007

(65) Prior Publication Data
US 2010/0218895 A1 Sep. 2, 2010

(30) Foreign Application Priority Data
Mar. 22, 2006 (JP) .................. 2006-078127

(51) Int. Cl.
*C23C 16/00* (2006.01)
*C23C 16/50* (2006.01)
*C23F 1/00* (2006.01)
*H01L 21/306* (2006.01)

(52) U.S. Cl. ............... 156/345.28; 156/345.24; 118/715

(58) Field of Classification Search .......... 118/728–732; 156/345.51–345.55
See application file for complete search history.

(56) References Cited

U.S. PATENT DOCUMENTS

| | | | |
|---|---|---|---|
| 2002/0073924 A1* | 6/2002 | Chiang et al. | 118/723 R |
| 2006/0238953 A1* | 10/2006 | Hanawa et al. | 361/234 |

FOREIGN PATENT DOCUMENTS

| | | |
|---|---|---|
| JP | 1-321136 | 12/1989 |
| JP | 2000 200825 | 7/2000 |
| JP | 2002 198353 | 7/2002 |
| JP | 2003 347395 | 12/2003 |
| JP | 2004 40046 | 2/2004 |
| JP | 2004 40047 | 2/2004 |

OTHER PUBLICATIONS

Office Action issued Dec. 30, 2011 in Taiwan Patent Application No. 096109758, filed Mar. 21, 2007 (with English-language translation of related parts thereof).

* cited by examiner

*Primary Examiner* — Parviz Hassanzadeh
*Assistant Examiner* — Tiffany Nuckols
(74) *Attorney, Agent, or Firm* — Rothwell, Figg, Ernst & Manbeck, P.C.

(57) ABSTRACT

A plasma processing apparatus is provided with a replacement time detecting unit, which detects the status of residual charges which attract a semiconductor wafer and detects a time when an electrostatic chuck is to be replaced, at a time when a direct voltage application from a direct current source is stopped and the semiconductor wafer is brought up from the electrostatic chuck.

9 Claims, 4 Drawing Sheets

PLASMA PROCESSING APPARATUS

BACKGROUND OF THE INVENTION

The present invention relates to a plasma processing apparatus for performing a plasma process, e.g., plasma etching, plasma CVD (Chemical Vapor Deposition) or the like on a target substrate such as a semiconductor wafer, a LCD (Liquid Crystal Display) glass substrate, or the like.

BACKGROUND OF THE INVENTION

Conventionally, in the field of manufacturing semiconductor devices, LCDs and the like, there has been employed a plasma processing apparatus which performs plasma etching or plasma CVD by means of generating a plasma. In such plasma processing apparatus, the plasma is generated in a depressurized atmosphere of a processing chamber. Accordingly, as a means to maintain a target substrate in a vacuum chamber, an electrostatic chuck is widely utilized.

As for the plasma processing apparatus using the electrostatic chuck, it may be difficult to separate the target substrate from the electrostatic chuck after stopping an application of a DC voltage to the electrostatic chuck, because the target substrate is kept strongly attached to the electrostatic chuck due to residual charges remaining in the electrostatic chuck. Thus, the target substrate would be forcibly detached from the electrostatic chuck, which may incur damage thereon. To solve this problem, there is known a method of reducing the speed of lifting the target substrate if an attraction force by residual charges is over a specific level (see, for example, Japanese Patent Laid-open Publication No. 2001-257252). Further, there is also known a method of lifting the target substrate by a pressure of a thermally conductive gas supplied to a rear surface of the target substrate if an attraction force by residual charges is over a certain level (see, for example, Japanese Patent Laid-open Publication No. 2000-200825).

The purpose of the aforementioned conventional methods is to separate the target substrate from the electrostatic chuck without inflicting a damage on the target substrate in the event that the amount of residual charges is so great that the target substrate cannot be readily separated from the electrostatic chuck. However, once such occasion arises, it takes time to separate the target substrate from the electrostatic chuck and unload it outside the processing chamber, resulting in a reduction of productivity. Further, since these methods do not reduce the residual charges in the electrostatic chuck in the process of separating the target substrate physically, they do not provide a fundamental solution to the problem.

SUMMARY OF THE INVENTION

In view of the above, therefore, an object of the present invention is to provide a plasma processing apparatus capable of improving productivity by preventing an occasion that a target substrate cannot be separated from an electrostatic chuck due to residual charges in the electrostatic chuck.

In accordance with a first aspect of the present invention, there is provided a plasma processing apparatus including a processing chamber for accommodating a target substrate therein and performing a plasma process on the target substrate by generating a plasma therein; a mounting table, disposed in the processing chamber, for mounting the target substrate thereon; an electrostatic chuck, disposed on the mounting table and having an electrode embedded in an insulating layer, for attracting and holding the target substrate thereon electrostatically by a DC voltage applied to the electrode from a DC power supply; and a substrate supporting mechanism, configured to be protrusible from the inside of the mounting table, for supporting the target substrate above the mounting table.

The plasma processing apparatus further includes a replacement timing detecting unit for detecting a replacement timing of the electrostatic chuck by detecting a state of residual charges of the electrostatic chuck when the target substrate is lifted up from the electrostatic chuck by the substrate supporting mechanism after the application of the DC voltage from the DC power supply is stopped.

In the first aspect of the present invention, the replacement timing detecting unit may compare an attraction force of the target substrate by the residual charges with a preset value, and detect the replacement timing of the electrostatic chuck when the attraction force is equal to or greater than the preset value.

In the first aspect of the present invention, the replacement timing detecting unit may detect the state of the residual charges of the electrostatic chuck based on a torque or a rotational speed of a driving motor which operates to protrude the substrate supporting mechanism from the mounting table.

In the first aspect of the present invention, the replacement timing detecting unit compares the attraction force of the target substrate by the residual charges with a preset value, and changes the normal process of lifting up the target substrate by the substrate supporting mechanism to an emergency processing if the attraction force is equal to or greater than the preset value.

In accordance with a second aspect of the present invention, there is provided a plasma processing apparatus including a processing chamber for accommodating a target substrate therein and performing a plasma process on the target substrate by generating a plasma therein; a mounting table, disposed in the processing chamber, for mounting the target substrate thereon; an electrostatic chuck, disposed on the mounting table and having an electrode embedded in an insulating layer, for attracting and holding the target substrate thereon electrostatically by a DC voltage applied to the electrode from a DC power supply; and a substrate supporting mechanism, configured to be protrusible from the inside of the mounting table, for supporting the target substrate above the mounting table.

The plasma processing apparatus further includes a charge removing process control unit for changing a charge removing process of the electrostatic chuck by detecting a state of residual charges of the electrostatic chuck when the target substrate is lifted up from the electrostatic chuck by the substrate supporting mechanism after the application of the DC voltage from the DC power supply is stopped.

In accordance with the second aspect, the charge removing process control unit may increase an internal pressure of the processing chamber, keeping up with an increase of the residual charges of the electrostatic chuck.

In accordance with the second aspect, the charge removing process control unit may detect detects the state of the residual charges of the electrostatic chuck based on a torque or a rotational speed of a driving motor which operates to protrude the substrate supporting mechanism from the mounting table.

In accordance with the second aspect, the charge removing process control unit may compare an attraction force by the residual charges for attracting the target substrate with a preset value, and change the normal process of lifting up the target substrate by the substrate supporting mechanism into an emergency process if the attraction force is equal to or greater than the preset value.

DETAILED DESCRIPTION OF THE EMBODIMENTS

Figure 1:
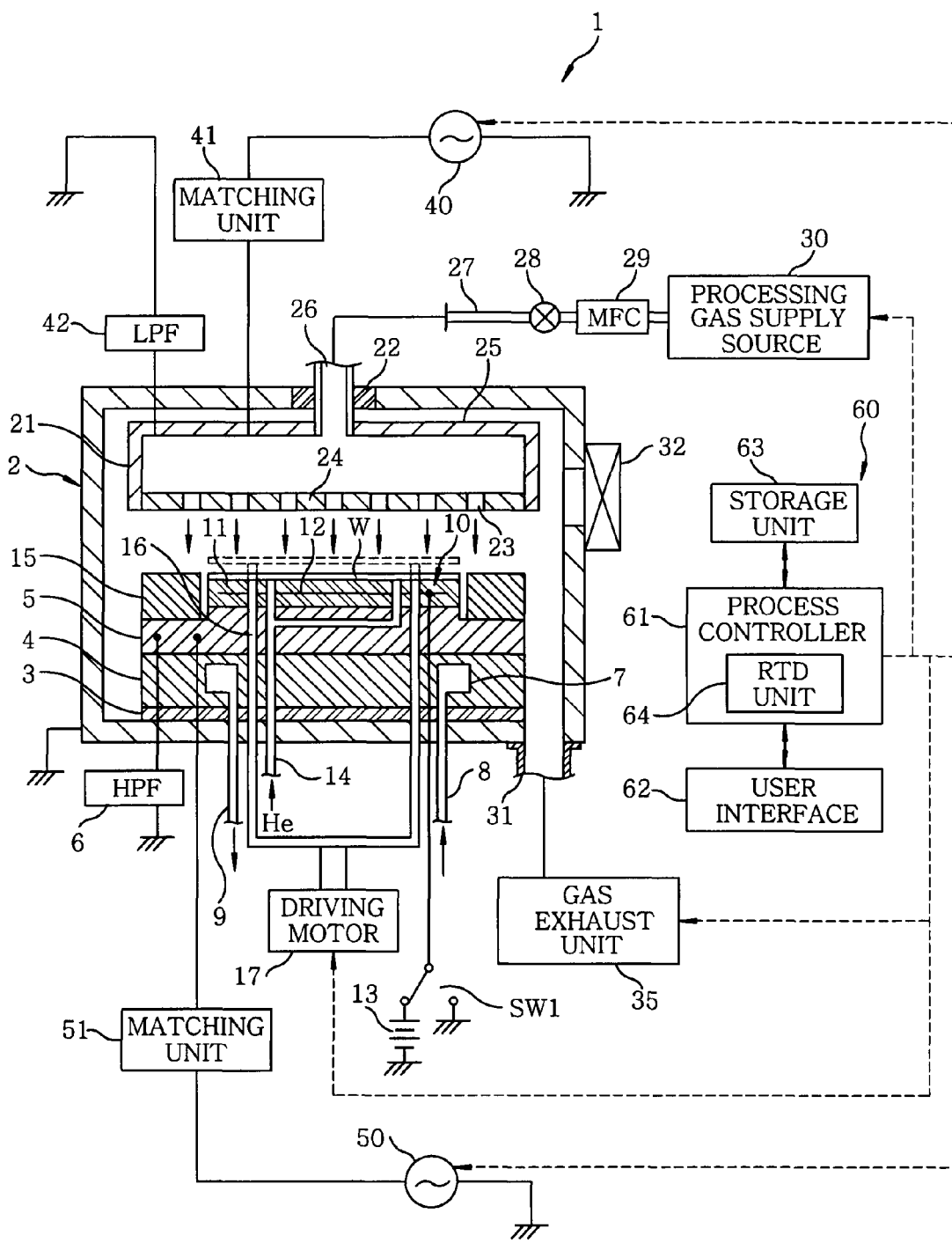
FIG. 1 is a cross sectional view showing a schematic configuration of a plasma etching apparatus in accordance with an embodiment of the present invention.

Hereinafter, embodiments of the present invention will be described with reference to the accompanying drawings. FIG. 1 is a schematic cross sectional view of a plasma etching apparatus 1 serving as a plasma processing apparatus in accordance with an embodiment of the present invention.

The plasma etching apparatus 1 is configured as a capacitively coupled parallel plate type etching apparatus having an upper and a lower electrode plate placed to face each other in parallel and respectively coupled to power supplies for plasma generation.

The plasma etching apparatus 1 has a cylindrical processing chamber (processing vessel) 2 formed of, for example, aluminum whose surface is anodically oxidized, and the chamber 2 is grounded. A substantially columnar susceptor support 4 for mounting thereon a target object to be processed, e.g., a semiconductor wafer W, is installed at a bottom portion of the processing chamber 2 via an insulating plate 3 such as ceramic. Further, a susceptor 5 serving as a lower electrode is mounted on the susceptor support 4, and the susceptor 5 is connected to a high pass filter (HPF) 6.

A coolant path 7 is formed inside the susceptor support 4, and a coolant is introduced into the coolant path 7 via a coolant introducing line 8 and is discharged via a coolant discharge line 9. By the circulation of the coolant through the coolant path 7, the cold heat of the coolant is transferred to the semiconductor wafer W via the susceptor 5, whereby the semiconductor wafer W is maintained at a desired temperature level.

The susceptor 5 has a disc-shaped upper central portion which is protruded higher than its peripheral portion, and an electrostatic chuck 10 that is shaped substantially identical to the semiconductor wafer W is disposed on the upper central portion of the susceptor 5. The electrostatic chuck 10 includes an electrode 12 embedded in an insulating layer 11. The semiconductor wafer W is electrostatically attracted to the electrostatic chuck 10 by, for example, a Coulomb force generated by applying a DC voltage of, for example, 1.5 kV to the electrode 12 from a DC power supply 13 connected thereto.

Further, formed through the insulating plate 3, the susceptor support 4, the susceptor 5 and the electrostatic chuck 10 is a gas channel 14 for supplying a heat transfer medium (e.g., a He gas) to the rear surface of the semiconductor wafer W. Thus, the cold heat of the susceptor 5 is transferred to the semiconductor wafer W through the heat transfer medium, whereby the semiconductor wafer W is regulated at a specific temperature level.

An annular focus ring 15 is disposed on an upper peripheral portion of the top surface of the susceptor 5 to surround the semiconductor wafer W loaded on the electrostatic chuck 10. The focus ring 15 is formed of, e.g., a conductive material such as silicon and serves to improve etching uniformity.

Formed through the insulating plate 3, the susceptor support 4, the susceptor 5 and the electrostatic chuck 10 is a plurality of (for example, three) lift pins 16 which are adapted to be vertically movable by a driving motor 17. When the lift pins 16 are lowered, their top portions are hidden inside the susceptor 5, whereas when the lift pins are raised, their top portions protrude above the susceptor 5, thereby sustaining the semiconductor wafer W above the susceptor 5. In this state, the semiconductor wafer W can be transferred from or to a wafer transfer arm (not shown).

An upper electrode 21 is disposed above the susceptor 5, while facing it in parallel. The upper electrode 21 is supported at a top portion of the processing chamber 2 via an insulating member 22. The upper electrode 21 includes an electrode plate 24, and an electrode support 25 which serves to support the electrode 24 and is made up of a conductive material. The electrode plate 24 is configured to face the susceptor 5 and is provided with a number of injection openings 23. The electrode plate 24 is formed of, for example, aluminum whose surface is anodically oxidized (alumite-treated) and covered with a quartz. A distance between the susceptor 5 and the upper electrode 21 is variable.

A gas inlet port 26 is formed at a center of the electrode support 25 of the upper electrode 21, and a gas supply line 27 is coupled to the gas inlet port 26. Further, the gas supply line 27 is connected, via a valve 28 and a mass flow controller (MFC) 29, to a processing gas supply source 30 for supplying an etching gas serving as a processing gas.

A gas exhaust line 31 is connected to a bottom portion of the chamber 2, and a gas exhaust unit 35 is coupled to the gas exhaust line 31. The gas exhaust unit 35 includes a vacuum pump such as a turbo molecular pump, and serves to create a depressurized atmosphere in the processing chamber 2, i.e., to evacuate the chamber 2 down to a specific vacuum level, e.g., 1 Pa or less. Further, a gate valve 32 is installed at a sidewall of the processing chamber 2. The semiconductor wafer W is transferred between the processing chamber 2 and an adjacent load lock chamber (not shown) while the gate valve 32 is opened.

A first high frequency power supply 40 is connected to the upper electrode 21 via a matching unit 41, and a low pass filter (LPF) 42 is connected to the upper electrode 21. The first high frequency power supply 40 has a frequency ranging from 50 to 150 MHz. By applying the high frequency power in such a frequency range, a high-density plasma in a desirable dissociated state can be generated in the processing chamber 2.

Further, a second high frequency power supply 50 is connected to the susceptor 5 serving as the lower electrode via a matching unit 51. The second high frequency power supply 50 has a frequency range lower than that of the first high frequency power supply 40. By applying a power of a frequency in such a range, a proper ionic action can be facilitated without inflicting a damage on the semiconductor wafer W being processed. Preferably, the frequency of the second high frequency power supply 50 is within the range from about 1 to 20 MHz.

The whole operation of the plasma etching apparatus 1 having the above-described configuration is controlled by a control unit 60. The control unit 60 includes a process controller 61 having a CPU for controlling individual components of the plasma etching apparatus 1; a user interface 62; and a storage unit 63.

The user interface 62 includes a keyboard for a process manager to input a command to operate the plasma etching apparatus 1, a display for visualizing and showing an operational status of the plasma etching apparatus 1 and the like.

The storage unit 63 stores therein, e.g., control programs (software) and recipes including processing condition data and the like to be used in realizing various processes which are performed in the plasma etching apparatus 1 under the control of the process controller 61. When a command is received from the user interface 62, a necessary recipe is retrieved from the storage unit 63 and executed by the process controller 61 whereby a desired process is carried out in the plasma etching apparatus 1 under the control of the process controller 61. The control programs and/or the recipes including the processing condition data can be retrieved from a computer-readable storage medium (e.g., a hard disk, a compact disk (CD), a flexible disk, a semiconductor memory or the like), or can be used on line by being transmitted from another apparatus via, e.g., a dedicated line, whenever necessary.

The process controller 61 includes a replacement timing detecting (RTD) unit 64. The replacement timing detecting unit 64 detects replacement timing of the electrostatic chuck 10 by detecting a state of residual charges in the electrostatic chuck 10 that attract the semiconductor wafer W when the wafer W is lifted up from the electrostatic chuck 10 after the application of a DC voltage from the DC power supply 13 is stopped. That is, though the electrostatic chuck 10 has the insulating layer 11 as described above, the insulating layer 11 is gradually worn out by an action of the plasma and the like as the plasma etching is repeatedly performed. If the insulating layer 11 is worn out, residual charges in the electrostatic chuck 10 increase, making it difficult to separate the semiconductor wafer W from the electrostatic chuck 10.

That is, when the application of the DC voltage from the DC power supply 13 is stopped, a charge eliminating process is performed to remove the residual charges from the electrostatic chuck 10. For example, the charge eliminating process can be implemented by, for example, applying an inverse voltage to the electrostatic chuck 10 or by allowing a plasma to act thereon. When the insulating layer 11 is not worn out, the charge elimination of the electrostatic chuck 10 can be accomplished by this charge eliminating process, so that the residual charges can be diminished to the extent that the semiconductor wafer W is smoothly lifted up by the lift pins 16.

However, if the insulating layer 11 is gradually consumed as time passes by, the residual charges increase. In the present embodiment, when the consumption of the insulating layer 11 has progressed considerably and the residual charges have increased with the lapse of time and as a result it is expected that the semiconductor wafer W will not be lifted up soon afterwards though it can be currently raised by the lift pins 16, that moment is detected as timing for the replacement of the electrostatic chuck 10. Then, the user interface 62 displays the advent of the replacement timing for the electrostatic chuck 10. If the electrostatic chuck 10 is replaced with a new one based on this information from the user interface 62, it is possible to prevent the occurrence that the electrostatic chuck 10 cannot be separated from the electrostatic chuck 10, and, as a result, productivity can be improved higher than in conventional cases.

Figure 2:
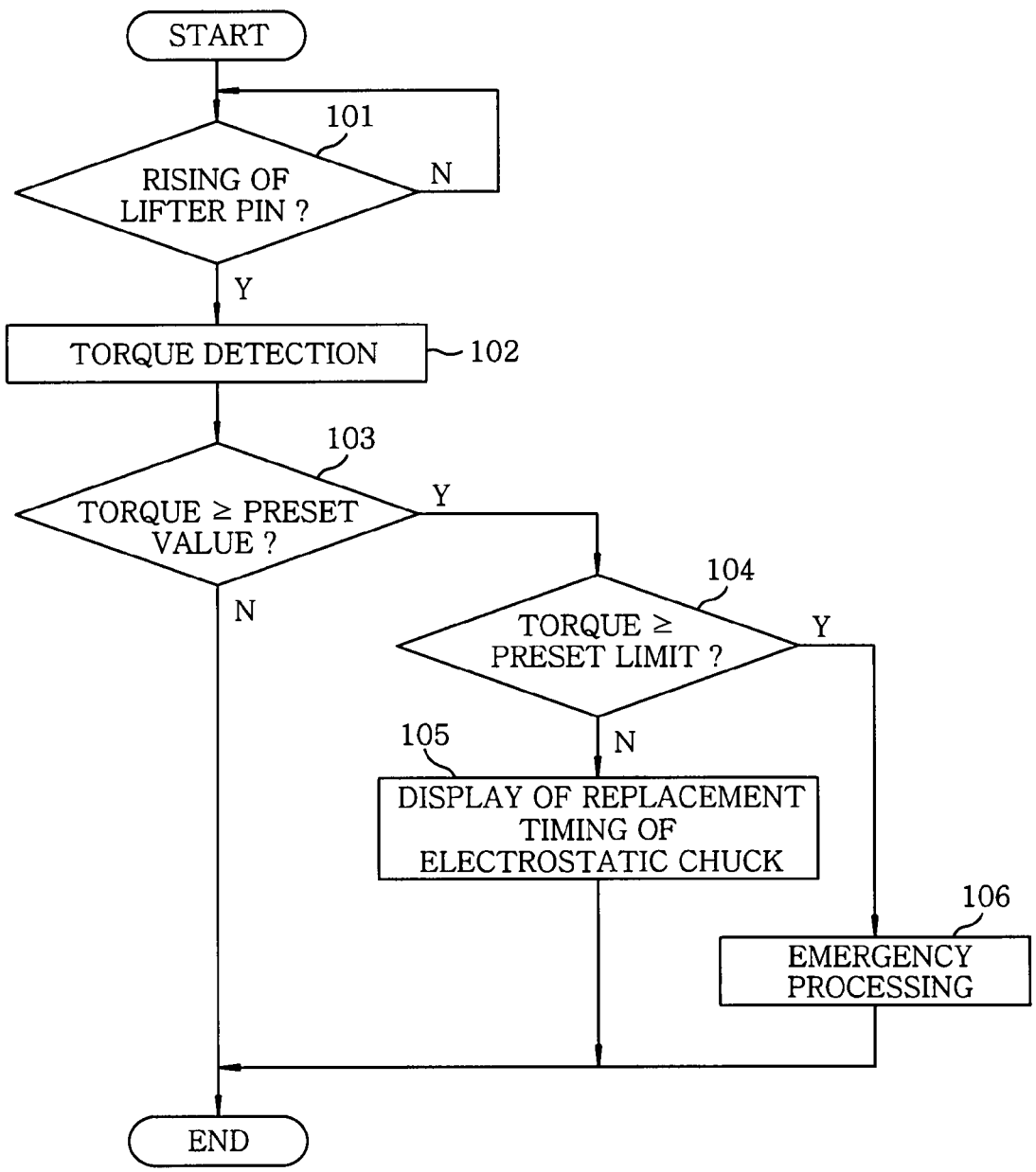
FIG. 2 sets forth a flow chart to describe an operation of the plasma etching apparatus of FIG. 1.

Referring to FIG. 2 there is provided a flow chart for describing an operation of the replacement timing detecting unit 64 of the process controller 61. As shown in FIG. 2, the replacement timing detecting unit 64 monitors the timing when the rising motion of the lift pins 16 is made while a plasma process is being performed by the plasma etching apparatus 1 (step 101).

When the lift pins 17 are risen, the replacement timing detecting unit 64 detects a torque of a driving motor 17 (step 102), and compares the detected torque with a preset value (step 103). If the detected torque is smaller than the preset value, the operation of the replacement timing detecting unit 64 is completed.

Meanwhile, if the detected torque is larger than or equal to the preset value (step 103), it is determined whether the detected torque is no smaller than a preset limit (step 104). If the detected torque is smaller than the limit, the user interface 62 displays an advent of replacement timing for the electrostatic chuck 10 (step 105).

The limit is a value indicating a high likelihood of a damage being inflicted on the semiconductor wafer W if the semiconductor wafer W is lifted up. The limit is greater than the preset value. In the event that the detected torque is equal to or greater than the limit, an emergency processing is conducted (step 106). This emergency processing at least includes a process of temporarily stopping the rising of the lift pins 16 by stopping the driving motor 17.

Thereafter, an alarm is made or the rising speed of the lift pins 16 is minutely increased. This process is conducted to avoid a risk when the semiconductor wafer W is strongly adhered to the electrostatic chuck 10 not because of a temporal change of the electrostatic chuck 10 but because of an abrupt increase of residual charges, or to avoid a risk when the semiconductor wafer W is strongly adhered to the electrostatic chuck 10 due to an increase of the residual charges as a result of ignoring the display indicating the necessity of replacement of the electrostatic chuck 10.

Further, though the replacement timing detecting unit of the process controller 61 detects the state of the residual charges in the electrostatic chuck 10 based on the torque of the driving motor 17 when the semiconductor wafer W is lifted up by the lift pins 16 in the present embodiment described above, other methods can be employed to detect the residual charges. For example, the state of the residual charges can be detected based on a rotational speed of the driving motor 17.

Besides, also available is a configuration in which a residual charge monitor is provided on a wiring between the chuck electrode 12 and the DC power supply 13 so that the progression of the charge eliminating process of the electrostatic chuck 10 can be detected by the control unit 60. This residual charge monitor functions to measure the amount of charges remaining in the electrostatic chuck 10 by, for example, subtracting the amount of charges that flows when a switch SW1 is switched to the earth side from the amount of charges that flows when the switch S1 is connected in series to the DC power supply 13. Moreover, it is also possible to detect the state of the residual charges of the electrostatic chuck 10 by monitoring bending, flipping, or the like of the semiconductor wafer W on the susceptor 5 by a CCD sensor.

Hereinafter, a plasma etching process of a semiconductor wafer W, which is performed by using the plasma etching apparatus 1 having the above-described configuration, will be explained. First, after the gate valve 32 is opened, the semiconductor wafer W is loaded into the processing chamber 2 from a load lock chamber (not shown) and is placed on the lift pins 16. Then, the lift pins 16 are lowered, whereby the semiconductor wafer W is mounted on the electrostatic chuck 10. Subsequently, the gate valve 32 is closed, and the processing chamber 2 is evacuated to a preset vacuum level. Thereafter, by applying a DC voltage from the DC power supply 13 to the electrostatic chuck 10, the semiconductor wafer W is electrostatically attracted to the electrostatic chuck 10 to be held thereon.

The valve 28 is then opened, and the processing gas (etching gas) is introduced from the processing gas supply source 30 into the hollow space inside the upper electrode 21 via the gas supply line 27 and the gas inlet port 26, while its flow rate is controlled by the mass flow controller 29, and is uniformly discharged toward the semiconductor wafer W through the injection openings 23 formed in the electrode plate 24, as indicated by arrows in FIG. 1.

Then, the internal pressure of the processing chamber 2 is kept at a specific pressure level. Thereafter, a high frequency power of a certain frequency is applied from the first high frequency power supply 40 to the upper electrode 21. As a result, a high frequency electric field is generated between the upper electrode 21 and the susceptor 5 serving as the lower electrode, whereby the processing gas is converted into a plasma.

Meanwhile, a high frequency power of a frequency lower than that from the first high frequency power supply 40 is applied from the second high frequency power supply 50 to the susceptor 5 serving as the lower electrode. Accordingly, ions in the plasma are attracted to the susceptor 5, and etching anisotropy is improved due to ion assist.

Upon the completion of the plasma etching, the supply of the high frequency powers and the processing gas is stopped, and the semiconductor wafer W is unloaded from the processing chamber 2 in a sequence described above. At this time, when the semiconductor wafer W on the electrostatic chuck 10 is lifted up by the lift pins 16, a torque of the driving motor 10 is detected whereby the state of residual charges in the electrostatic chuck 10 is detected, and the above-described process in FIG. 2 is performed by the replacement timing detecting unit 64 of the process controller 61.

Figure 3:
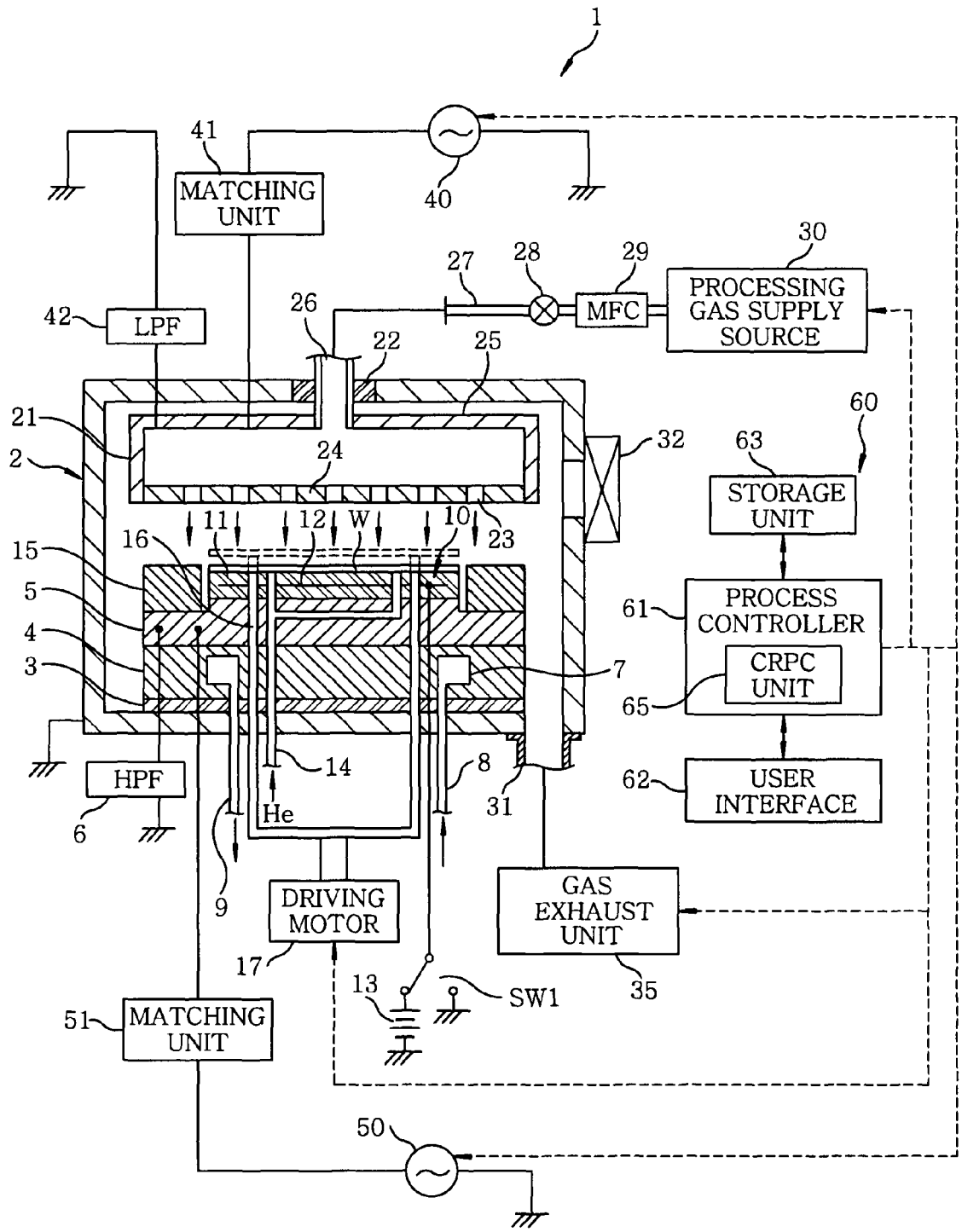
FIG. 3 presents a cross sectional view showing a schematic configuration of a plasma etching apparatus in accordance with another embodiment of the present invention.

FIG. 3 illustrates a configuration of a plasma etching apparatus 1a in accordance with another embodiment of the present invention. The plasma etching apparatus 1a in this embodiment includes a charge removing process control (CRPC) unit 65 incorporated in the process controller 61. Except this, the other configuration of the plasma etching apparatus 1a is identical with that of the plasma etching apparatus 1 described above. Thus, like reference numerals will be assigned to like parts and redundant description will be omitted.

Figure 4:
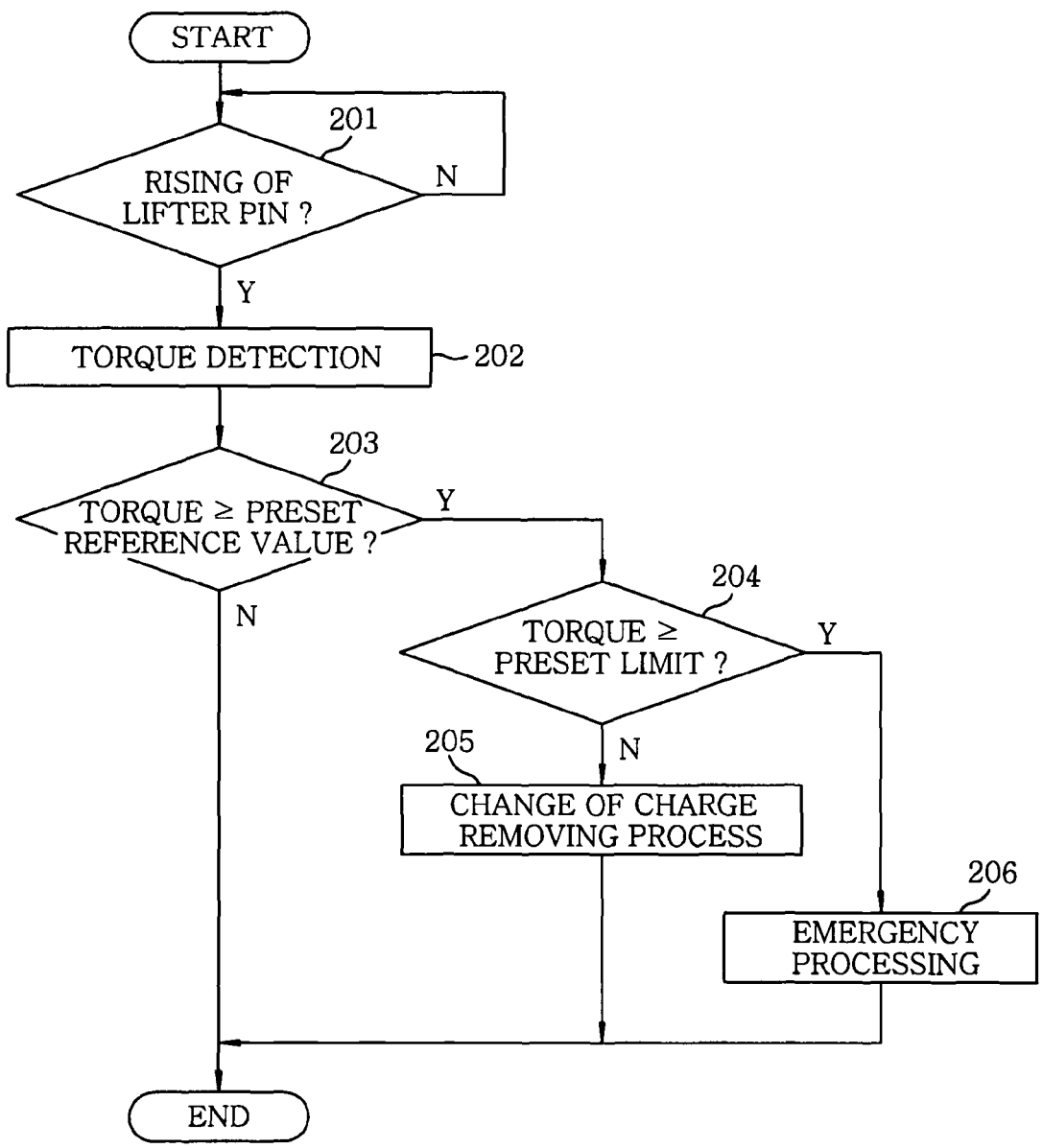
FIG. 4 depicts a flow chart to describe an operation of the plasma etching apparatus of FIG. 3.

FIG. 4 is a flow chart for describing an operation of the charge removing process control unit 65 in accordance with the present embodiment. As shown in the drawing, the charge removing process control unit 65 monitors the timing when rising motion of lift pins 16 is made while a plasma process is being performed by the plasma etching apparatus 1a (step 201).

When the lift pins 16 are raised, the charge removing process control unit 65 detects a torque of the driving motor 17 (step 202), and compares the detected torque with a preset value (step 203). If the detected torque is smaller than the preset value, the operation of the charge removing process control unit 65 is completed.

Meanwhile, if the detected torque is equal to or larger than the preset value (step 203), it is determined whether the detected torque is no smaller than a preset limit (step 204). If the detected torque is smaller than the preset limit, a change of the charge removing process of the electrostatic chuck 10 is performed (step 205). Here, the change of the charge removing process represents the one that is made to enable a stronger charge removing operation, for example, an increase of an inverse voltage, an increase of an internal pressure of the processing chamber 1 and the like. As described, by changing the charge removing process successively depending on the consumption state of the insulating layer 11 of the electrostatic chuck 10, an optimum charge removing process can always be conducted.

That is, by actively discharging charges remaining in the semiconductor wafer W while setting the internal pressure of the processing chamber 2 to be, for example, 20 to 50 Pa during a time period after the lift pins 16 contact the rear surface of the semiconductor wafer W till they lift the semiconductor wafer W up to a certain height at a low speed, it is possible to separate the semiconductor wafer W from the electrostatic chuck 10 without causing the semiconductor wafer W to be flipped or broken.

Further, the optimum charge removing process can be selected by conducting an experiment in advance, wherein the experiment includes performing various charge removing processes actually; and then detecting a state of residual charges in the electrostatic chuck 10 by detecting a torque when the semiconductor wafer W is lifted up by the lift pins 16.

Moreover, as in the first embodiment described above, the preset limit is a value indicating a high likelihood of a damage being inflicted on the semiconductor wafer W if the semiconductor wafer W is lifted up. The limit is greater than the preset value. In the event that the detected torque is equal to or greater than the limit, an emergency processing is conducted (step 206). This emergency processing includes a process of temporarily stopping the rising of the lift pins 16 by stopping the driving motor 17.

Thereafter, an alarm is set forth or the speed of the lift pins 16 is minutely increased. This process is conducted to avoid a risk when the semiconductor wafer W is strongly adhered to the electrostatic chuck 10 not because of a temporal change of the electrostatic chuck 10 but because of an abrupt increase of residual charges, or to avoid a risk when the semiconductor wafer W is strongly adhered to the electrostatic chuck 10 due to an increase of the residual charges as a result of ignoring the display indicating the necessity of replacement of the electrostatic chuck 10.

Further, though the charge elimination control unit 65 of the process controller 61 detects the state of the residual charges of the electrostatic chuck 10 based on the torque of the driving motor 17 at the moment the semiconductor wafer W is lifted up by the lift pins 16, the residual charges may be detected in other ways, for example, based on a rotational speed of the driving motor 17.

In accordance with the embodiments described above, it can be prevented that the semiconductor wafer W cannot be separated from the electrostatic chuck 10 due to the residual charges thereof. Thus, productivity can be improved higher than in conventional cases. Further, it is to be noted that the present invention is not limited to the above-described embodiments but various modifications can be made. For example, the plasma etching apparatus is not limited to the parallel plate type apparatus in which high frequency powers are respectively applied to the upper and lower electrodes, but the present invention can be applied to, for example, a plasma processing apparatus of a type in which dual high frequency powers are applied only to the lower electrode or other various types of plasma processing apparatuses.

INDUSTRIAL APPLICABILITY

The plasma processing apparatus in accordance with the present invention has advantages when it is applied to the manufacture of semiconductor devices. Therefore, the present invention has an industrial applicability.

What is claimed is:

1. A plasma processing method comprising:
   loading a target substrate into a processing chamber and placing the target substrate on lift pins which are protrusible from an inside of a mounting table;
   mounting the target substrate on an electrostatic chuck of the mounting table by lowering the lift pins;
   attracting the target substrate to the electrostatic chuck by applying a DC voltage to the electrostatic chuck;
   performing a plasma processing on the target substrate in the processing chamber;
   detecting a state of residual charges of the electrostatic chuck when the target substrate on which the plasma processing has been performed is lifted up from the electrostatic chuck by the lift pins after the application of the DC voltage; and
   detecting a replacement timing of the electrostatic chuck based on the detected state of the residual charges, wherein the detecting the state of the residual charges of the electrostatic chuck detects the state of the residual charges of the electrostatic chuck based on a torque or a rotational speed of a driving motor which operates to protrude the lift pins from the mounting table.

2. The plasma processing method of claim 1, wherein the detecting the replacement timing of the electrostatic chuck comprises:
   comparing an attraction force of the target substrate by the residual charges with a first preset value; and
   detecting the replacement timing of the electrostatic chuck when the attraction force is equal to or greater than the first preset value.

3. The plasma processing method of claim 2, wherein the detecting the replacement timing of the electrostatic chuck further comprises:
   comparing the attraction force of the target substrate by the residual charges with a second preset value; and
   stopping lifting up the target substrate by the lift pins if the attraction force is equal to or greater than the second preset value.

4. The plasma processing method of claim 1, further including providing an indicator to a user in response to said detecting the replacement timing of the electrostatic chuck.

5. The plasma processing method of claim 4, wherein the step of providing the indicator includes displaying an indication that the electrostatic chuck needs to be replaced on a user interface.

6. A plasma processing apparatus comprising:
   a processing chamber for accommodating a target substrate therein and performing a plasma process on the target substrate by generating a plasma therein;
   a mounting table, disposed in the processing chamber, for mounting the target substrate thereon;
   an electrostatic chuck, disposed on the mounting table and having an electrode embedded in an insulating layer, for attracting and holding the target substrate thereon electrostatically by a DC voltage applied to the electrode from a DC power supply;
   a substrate supporting mechanism, configured to be protrusible from the inside of the mounting table, for supporting the target substrate above the mounting table; and
   a replacement timing detecting unit configured to detect a replacement timing of the electrostatic chuck by detecting a state of residual charges of the electrostatic chuck when the target substrate is lifted up from the electrostatic chuck by the substrate supporting mechanism after the application of the DC voltage from the DC power supply is stopped,
   wherein the replacement timing detecting unit detects the state of the residual charges of the electrostatic chuck based on a torque or a rotational speed of a driving motor which operates to protrude the substrate supporting mechanism from the mounting table.

7. The plasma processing apparatus of claim 6, wherein the replacement timing detecting unit compares an attraction force of the target substrate by the residual charges with a preset value, and detects the replacement timing of the electrostatic chuck when the attraction force is equal to or greater than the preset value.

8. The plasma processing apparatus of claim 6, wherein the replacement timing detecting unit compares the attraction force of the target substrate by the residual charges with a preset value, and changes the normal process of lifting up the target substrate by the substrate supporting mechanism to an emergency processing if the attraction force is equal to or greater than the preset value.

9. The plasma processing apparatus of claim 6, further including a user interface display which indicates the replacement timing of the electrostatic chuck detected by the replacement timing detecting unit.

* * * * *

UNITED STATES PATENT AND TRADEMARK OFFICE
CERTIFICATE OF CORRECTION

PATENT NO.       : 8,394,230 B2
APPLICATION NO. : 12/161238
DATED            : March 12, 2013
INVENTOR(S)      : Kazuyuki Tezuka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1131 days.

Signed and Sealed this
First Day of September, 2015

Michelle K. Lee
*Director of the United States Patent and Trademark Office*